United States Patent
Lee et al.

(10) Patent No.: US 10,815,372 B2
(45) Date of Patent: Oct. 27, 2020

(54) PROCESS FOR THE PREPARATION OF A FLAME-RETARDANT MODIFIED STYRENE-MALEIC ANHYDRIDE RESIN AND A COMPOSITION OF EPOXY RESINS AND THEIR APPLICATION TO COPPER CLAD LAMINATE AND PREPREG

(71) Applicant: NAN YA PLASTICS CORPORATION, Taipei (TW)

(72) Inventors: Cheng-Chung Lee, Taipei (TW); Jung-Hai Huang, Taipei (TW); Chien-Hsing Lee, Taipei (TW); Chun-Hsiung Yang, Taipei (TW)

(73) Assignee: NAN YA PLASTICS CORPORATION, Taipei (TW)

( * ) Notice: Subject to any disclaimer, the term of this patent is extended or adjusted under 35 U.S.C. 154(b) by 205 days.

(21) Appl. No.: 15/935,917

(22) Filed: Mar. 26, 2018

(65) Prior Publication Data

US 2018/0273744 A1 Sep. 27, 2018

(30) Foreign Application Priority Data

Mar. 27, 2017 (TW) .............................. 106110135 A

(51) Int. Cl.
| | |
|---|---|
| *C08L 63/00* | (2006.01) |
| *H05K 1/03* | (2006.01) |
| *H05K 3/02* | (2006.01) |
| *C09J 163/00* | (2006.01) |
| *C08L 35/06* | (2006.01) |
| *C08K 3/22* | (2006.01) |
| *C08K 5/00* | (2006.01) |
| *C08J 5/24* | (2006.01) |
| *C08K 3/36* | (2006.01) |

(52) U.S. Cl.
CPC ............... *C08L 63/00* (2013.01); *C08J 5/24* (2013.01); *C08K 3/22* (2013.01); *C08K 5/0066* (2013.01); *C08L 35/06* (2013.01); *C09J 163/00* (2013.01); *H05K 1/0353* (2013.01); *H05K 3/022* (2013.01); *C08J 2363/00* (2013.01); *C08J 2435/06* (2013.01); *C08K 3/36* (2013.01); *C08K 2003/2224* (2013.01); *C08K 2003/2227* (2013.01); *C08L 2201/02* (2013.01); *H05K 2203/068* (2013.01)

(58) Field of Classification Search
None
See application file for complete search history.

(56) References Cited

U.S. PATENT DOCUMENTS

| | | | |
|---|---|---|---|
| 6,509,414 B2 | 1/2003 | Tikart et al. | |
| 2011/0092640 A1* | 4/2011 | Tzou ................... | C08G 59/4261 524/600 |
| 2012/0024580 A1 | 2/2012 | Hsu | |
| 2015/0147799 A1 | 5/2015 | Li et al. | |

FOREIGN PATENT DOCUMENTS

| | | |
|---|---|---|
| BE | 627887 A | 5/1963 |
| CN | 101845199 A | 9/2010 |
| CN | 102050939 A | 5/2011 |
| CN | 103881059 A | 6/2014 |
| CN | 103881299 A | 6/2014 |
| CN | 104151473 A | 11/2014 |
| CN | 104761870 A | 7/2015 |
| CN | 104822717 A | 8/2015 |
| EP | 2915848 A1 | 9/2015 |
| JP | 2001502745 A | 2/2001 |
| JP | 2012111807 A | 6/2012 |

OTHER PUBLICATIONS

Li Yan-Xun, et al., "Thermosetting Resin-Study on the epoxy resin cured with BDPM/ST/MA tercopolymer", Thermosetting Resin, vol. 32, No. 2, p. 17-19, 31, Mar. 30, 2017.

* cited by examiner

*Primary Examiner* — Rachel Kahn
*Assistant Examiner* — Ha S Nguyen
(74) *Attorney, Agent, or Firm* — Li & Cai Intellectual Property (USA) Office

(57) ABSTRACT

This invention relates to flame-retardant modified maleic anhydride resins. This resin copolymer consists of styrene, maleic anhydride and, along with a halogen-free epoxy resin, interacts with a hydroxyl group to become a flame-retardant maleic anhydride copolymer that can be applied to copper clad laminate and prepreg. This composition comprises: (A) one or more epoxy resin mixtures; (B) modified styrene-maleic anhydride curing agent copolymer; (C) additives; (D) inorganic fillers. When the aggregate amount of components (A), (B) and (C) equals 100%, component (A), epoxy resin mixture, is 60%-80% in total weight, component (B), modified styrene-maleic anhydride curing agent copolymer, equals 10%-40% in total weight. This invention uses the copolymer of Styrene and Maleic anhydride to generate a flame-retardant hydroxyl group, and with the phosphorus additive, the above components eventually interact to form a flame-retardant modified maleic anhydride copolymer curing agent.

11 Claims, No Drawings

PROCESS FOR THE PREPARATION OF A FLAME-RETARDANT MODIFIED STYRENE-MALEIC ANHYDRIDE RESIN AND A COMPOSITION OF EPOXY RESINS AND THEIR APPLICATION TO COPPER CLAD LAMINATE AND PREPREG

TECHNICAL FIELDS

This invention involves an epoxy resin composition featuring high glass transition temperature, excellent heat-resisting properties and electrical characteristics that are suitable for the production of prepreg, adhesive, copper foil substrates that can be used in printing circuit boards for electronic components and high frequency or carrier materials of packaging.

PRIOR ART

Epoxy resin has been used for years in copper foil and printing circuit boards. With the development of technology and the increasing demand for environment protection, high frequency of electronic equipment is the latest trend, with halogen-free green sheets as the main demand in the industry. Especially in the development of wireless networks and satellite communications, signal transmissions and computer-related products have moved towards greater speed and higher frequency, communication products have been developed towards larger capacity and fast wireless transmission of voice, video and data have moved towards standardization, hence theses new-generation developments require a halogen-free high-frequency substrate.

Currently, the copper clad laminate, CCL used in printing circuit boards is predominately FR-4 in terms of both quantity and technical level. However, the development of the electronics industry is moving by leaps and bounds so relevant components such as printed circuit boards have continually developed to keep pace with the times. System products are light, short, power-saving and durable. Electronic components have an increase in working frequency when combined with the size-shrinking process. The operating voltage and transistor power consumption is continually lowering. Problems repeatedly occurred, originally without consideration, as an effect of reducing the allowable voltage noise, and has produced two major development directions for circuit board printing related to interconnection. First of all, high-density printed circuit boards: the main technology is the thin line, small holes, blinds holes and buried holes. Secondly, high-frequency electronic components and circuit boards of high-speed electronic products: the main technology is a board with a low dielectric constant, a low-loss factor, thin dielectric sheet and precision impedance control, etc.

The use of high frequency is an important development trend of printed circuit boards. Taking into consideration the increase in demand, the materials used and cost, the standard FR-4 substrate can meet these demands. Moreover, it uses higher-specification substrate materials; therefore, the low-media constant and low loss factor can meet the requirements of massive and fast transmission voice and video data. Taking environmental protection issues into account, the development trend of this product will ultimately move towards halogen-free elements.

The copper foil substrate material is mainly composed of a reinforcing material and resin composition and the outer lining is bonded with copper foil, so the resin composition is one of the main factors affecting the electrical properties of substrate. This patent will describe that the use of the resin composition is considerate of environmental protection requirements in addition to meeting the requirement of improving substrate electrical properties.

In patent BE-627887, it is proposed that copolymer of maleic anhydride and styrene is used as a hardening agent for an epoxy resin, but the disadvantage of the epoxy resin composition is the low glass transition temperature (Tg) for printed circuit board (PCB) manufacturing.

When used with epoxy resin, an acid anhydride-type hardener is not suitable to produce printed circuit boards with the addition of an accelerator.

Currently, the halogen-free resin system used in the copper foil substrate and printed circuit boards is a phosphorus-based epoxy resin, mainly the standard FR4 substrate. The main components are the phosphorus-containing epoxy resin and halogen-free ring oxygen resin, with dicyanamide as a hardener, following which the accelerator and solvent are added. Such an epoxy resin composition has a high glass transition temperature (Tg) (150 to 170° C.), but its poor heat resistance does not contribute much to the electrical properties of the substrate.

U.S. Pat. No. 6,509,414 discloses the use of a copolymer composing styrene and maleic anhydride (SMA) as a resin hardener that can improve heat resistance of a general bifunctional epoxy resin. Then a co-crosslinking agent, such as maleic anhydride (SMA) and tetrabromobisphenol A diglycidyl ether (TBBADGE) can be used to improve the glass transition temperature, whereby the proportion of the acid anhydride and the aromatic hydroxyl group (OH), and the epoxy resin equivalent ratio equals 50% to 150%. In the examples disclosed therein, it is understood that when the equivalent ratio is increased from 70% to 110%, the glass transition temperature (Tg by DSC) increased from 122° C. to 155° C. and the equivalent ratio increased from 110% to 150%. The glass transition temperature (Tg) was subsequently lowered from 155° C. to 137° C. This phenomenon shows that when the equivalent ratio is more than 110%, a crosslinking agent will no longer enhance the cross-linking density to increase glass transition temperature (Tg).

U.S. published patent US2012002458024A1 reveals that the use of a copolymer of styrene and maleic anhydride (SMA) was used as a resin hardener in a 1:4 proportion (EF-40). It uses dicyclopentadiene (DCPD) as the main resin with an added phosphorus phenolic resin and phosphorus-nitrogen flame-retardant to create a halogen-free component. The flame resistance reaches a 94-V0 flame-retardant threshold and electrical properties for use in halogen-free high frequency materials are improved, but when the proportion of EF-40 exceeds 60%, although there is a slight increase in electrical characteristics, the glass transition temperature Tg (Tg by DMA) decreases to approximately 170° C. from 186° C., and a flame-retardant effect cannot be achieved due to the decrease in the toughness of the plate and the substrate.

As described above, when the styrene-maleic anhydride copolymer is used as a hardening agent, a large amount is required. In addition to the restriction on the ratio, the additional amount of the phosphorus phenolic resin and phosphorus flame-retardant properties must also be increased when it develops into a halogen-free system.

SUMMARY OF THE INVENTION

The invention mainly involves a flame-retardant modified maleic anhydride hardener and an epoxy resin, the composition of which comprises one or more epoxy resin mixtures, a modified flame-resistant styrene acid anhydride copolymer, additives and inorganic fillers, wherein the total weight of the epoxy resin mixture consists of the modified flame-retardant styrene maleic anhydride copolymer as 100%, the epoxy resin mixture accounts for 60% to 80%, and the composition of the solid weight of the modified flame-retardant styrene maleic anhydride (SMA) copolymer accounts for 10% to 40%. The present invention uses a copolymer of styrene and maleic anhydride (SMA) to react with a hydroxyl group (OH) modifier to form a flame-retardant maleic anhydride copolymer hardener. It has a non-halogen type of hydroxyl group (OH). The use of the epoxy resin composition of the present invention has good heat resistance and excellent electrical characteristics, and is suitable for producing prepreg, adhesive sheets, and a copper foil substrate, and can be used in general or high frequency printed circuit boards.

After a copolymer of styrene and maleic anhydride (SMA) reacts with a halogen-free epoxy resin of hydroxyl group (OH), the flame-resistant modified maleic anhydride resin of the present invention gains flame-retardant properties of the modified maleic anhydride copolymer, including (A) one or more epoxy resin mixtures, (B) a modified flame-retardant styrene maleic anhydride (SMA) copolymer, (C) an additive and (D) an inorganic filler, whereby the weight of components (A), (B) and (C) are 100%; the weight of component (A) is 60% to 80% of the solid content of the composition, and component (B) styrene maleic anhydride copolyme is 10% to 40% of the total weight of solids.

DETAILED DESCRIPTION OF THE PREFERRED EMBODIMENT

First, the preparation of the refractory-modified maleic anhydride copolymer hardener:

The invention includes a new type of modified maleic anhydride copolymer hardener produced synthetically, and a new type of hardening agent combined with an epoxy resin, an inorganic filler and an accelerator can be used in the manufacturing of copper cladding (Copper Clad Laminate, CCL) and printed circuit boards.

The copolymer of the modified flame-retardant styrene maleic anhydride (SMA) has a structural formula represented by the following formula (I):

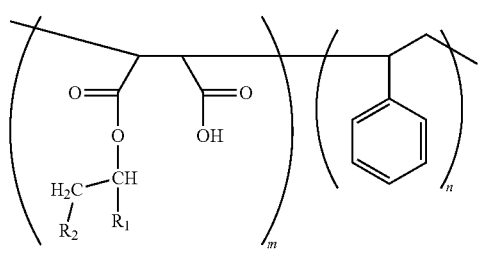

(I)

Where in m, n is a positive integer, and may be the same or different, $R_1$ is an epoxy resin chain, and may be bisphenol A epoxy resin, bisphenol F epoxy resin, phenolic epoxy resin or dicyclopentadiene epoxy resin, $R_2$ is a DOPO (9,10-dihydro-9-oxa-10-phosphaphenanthrene-10-oxide) derivative of a phosphorus-based compound, including DOPO (9,10-dihydro-9-oxa-10-phosphaphenanthrene-10-oxide), DOPO-HQ 10-(2,5-Dihydroxyphenyl)-10H-9-oxa-10-phosphaphenantbrene-10-oxide, DOPO-NQ (Quinone compound of 9,10-dihydro-9-oxa-10-phosphaphenanthrene-10-oxide), or similar.

The modified maleic anhydride copolymer hardener of this invention includes the following steps: 1. Take the phosphorus-based compound DOPO or DOPO derivative. 2. Take an equivalent amount of epoxy resin and phosphorus compounds for reaction. 3. Add the appropriate amount of catalyst for reaction. 4. A prepolymer forms after reaction, and then reacts with the SMA maleic anhydride resin to form a copolymer of a modified flame-retardant styrene maleic anhydride (SMA) as shown in structure (I). The phosphorus-based compound may be a derivative of DOPO, including DOPO (9,10-dihydro-9-oxa-10-phosphaphenanthrene-10-oxide), DOPO-HQ(10-(2,5-dihydroxyphenyl) -10H-9-oxa-10-phosphaphenanthrene-10-oxide), DOPO-NQ (Quinone compound of 9,10-dihydro-9-oxa-10-phosphaphenanthrene-10-oxide).

The epoxy resin used may be selected from a group consisting of epoxy equivalents ranging from 150 to 4,000; epoxy equivalents from 180 to 1,000 are preferred.

The above-mentioned epoxy resin and phosphorus-containing compound can react with the relative equivalent ratio of 1:0.2 to 1:2.0; the optimum amount being 1:0.5 to 1:1.5. The modified flame-retardant styrene maleic anhydride (SMA) copolymer has a molecular weight in the range of 2,000 to 15,000

The aforementioned catalysts may be selected from at least one of the following chemicals: methanesulfonic acid, trifluoromethanesulfonic acid, p-toluenesulfonic acid, triphenylphosphine, sodium acetate, potassium acetate, cobalt acetate, iron acetate, zinc acetate or lead acetate.

The polymer synthesis of this invention is as follows:

340 g of bisphenol A epoxy resin, 220 g of DOPO (9,10-dihydro-9-oxa-10-phosphaphenanthrene-10-oxide) and a suitable amount of a catalyst (cobalt acetate) (A) are added to a four-necked reactor including a stirrer, a thermostat, a condenser and nitrogen apparatus. The reaction took place for 5 hours by stirring until the composition reached a temperature to 150° C. to obtain a phosphorus-containing epoxy resin prepolymer (A). The DOPO (9,10-dihydro-9-oxa-10-phenanthroline-10-oxide) signal strength changes are tracked using GPC as an indicator of the residual strength of the DOPO(9,10-dihydro-9-oxa-10-phosphaphenanthrene-10-oxide) to determine the end point of the reaction.

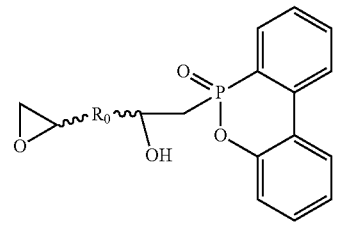

(A)

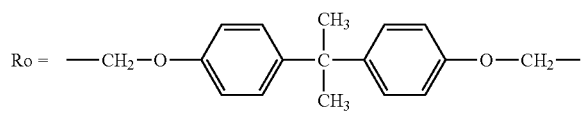

-continued

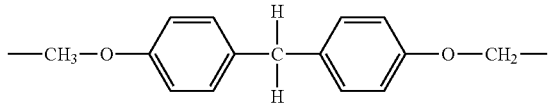
(B)

360 g of commercially-available copolymer of styrene and maleic anhydride (SMA) (EF40) and 60 g of phosphorus-containing epoxy resin prepolymer (A) were placed in a four-necked reaction flask and treated with 500 g of toluene at room temperature. 0.5 g of a benzyl dimethyl amine was added and the mixture was stirred for 30 minutes and then heated to 140° C. for 5 hours to obtain a modified flame-resistant styrene maleic anhydride copolymer (B). The structure is as follows.

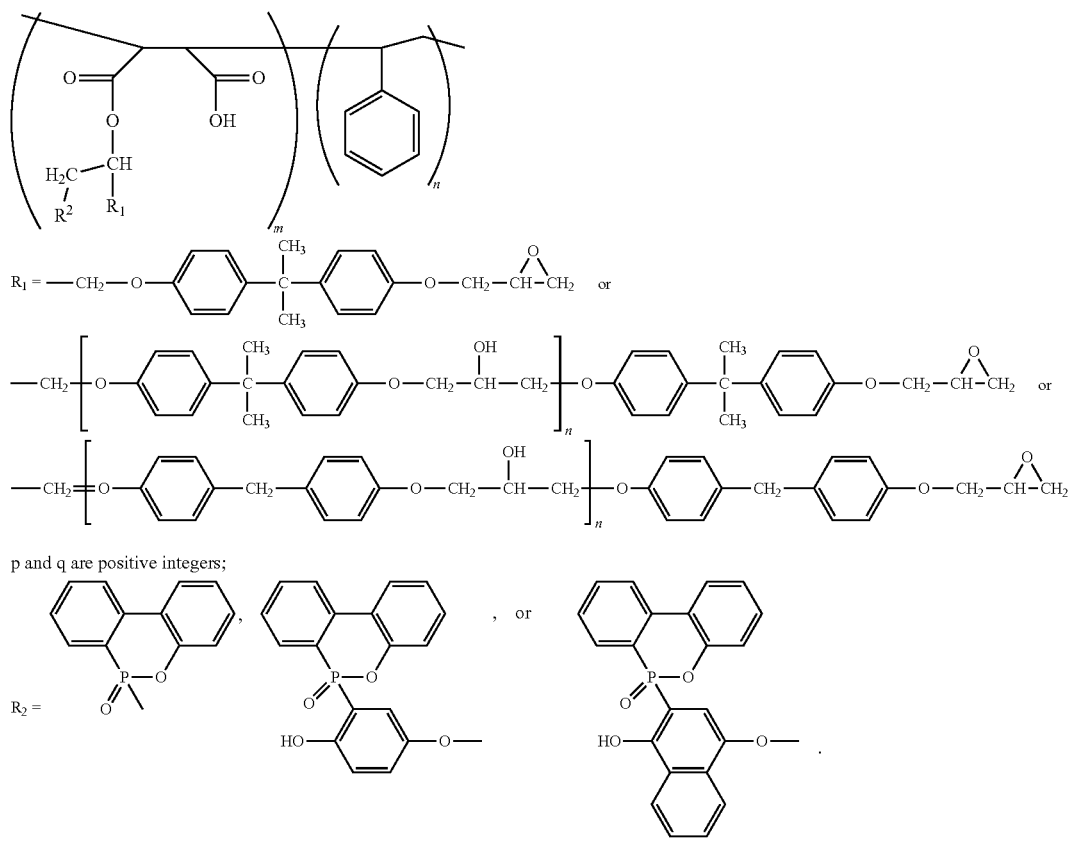

p and q are positive integers;

Second, the flame-resistant modified maleic anhydride copolymer hardener used in the copper foil substrate and its production.

The invention uses a flame-retardant modified phosphorous maleic anhydride copolymer hardener. The use of this new type of hardening agent with suitable epoxy resin, inorganic fillers, additives and accelerators to become a resin composition includes the manufacturing of copper substrate (Copper Clad Laminate, CCL) and printed circuit boards (PCB).

The resin composition includes one or more epoxy resin mixtures, accounting for 60 to 80% of the composition of solids, and modified maleic anhydride copolymer, accounting for 10 to 35% of the composition of solids, plus the additives and inorganic fillers.

The epoxy resin selected from the resin mixture can be a monofunctional group or a bifunctional epoxy resin. The epoxy equivalent is 150 to 4,000 g/eq selected from the group consisting of a bisphenol A epoxy resin or a bisphenol F epoxy resin. The enhancement of the glass transition temperature (Tg) and the heat resistance of the glass transition metal can be achieved with a polyfunctional epoxy resin; the epoxy equivalent is 150-3,000 g/eq, selected from a phenolic novolac-type resin or a nitrogen epoxy resin of an epoxy equivalent of 150-3,000 g/eq.

In addition, the series of benzene resin can be added to enhance the substrate processing characteristics (see the structural diagram below). For example, benzene series resin produced by KUEN BONG Chemical Industry has a trade name of KB-610F. The use of this type of resin significantly improves the glass transfer temperature (Tg), and the electrical and peel strength.

general formula

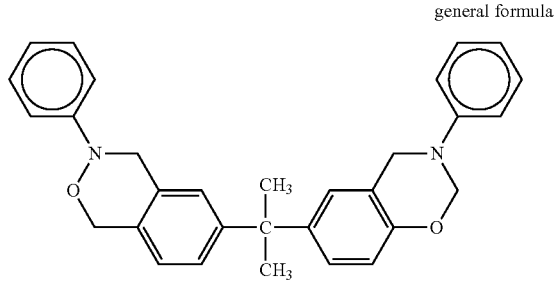

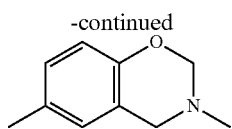

Dimethylphenolic (2,6 DMP) epoxy resins can be added to enhance the electrical properties of the substrate (see the structural diagram below). For example, dimethyl phenolic epoxy resins manufactured by Nan Ya Plastics under the trade name NPPN-260, (EEW=200 eq/g). The addition of 2,6 DMP resin improves the electrical and resin sheet mobility.

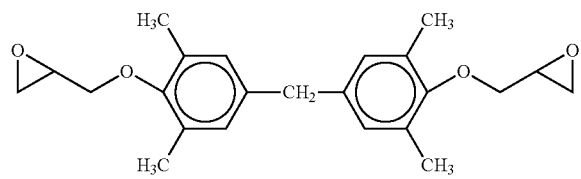

The epoxy resin mixture may be selected from one or more of the above resins depending on the workability and physical properties, etc.

The resin composition for the modification of the copolymer of the flame-retardant styrene maleic anhydride (SMA) is a non-halogen system for the purpose of environmental protection.

The additives described are added to improve or enhance the processing, mechanical and sheet properties due to the post-hardening characteristics of the resin composition. Additives can be high-molecular weight phenoxy resins, rubber and flame retardants, etc., such as adding InChem Corp. PKHS high-molecular weight phenoxy resin (Phenoxy resin) to improve the strength and impact of the system. Adding Hycar® CTBN 1,300×8 rubber (Rubber) can improve the strength of the copper, and adding an A187S silane and magnesium coupling agent can increase the adhesion between the substrate layer. Adding the flame-retardant Otsuka Chemical Co., Ltd. SPB-100 can increase the incombustible characteristics of the plate.

The purpose of the inorganic filler is to enhance rigidity of the resin composition in the invention after hardening to reduce the coefficient of thermal expansion, and to increase the flame-resistance. The inorganic filler may be one or more of a mixture of crystalline, spherical and molten silica, aluminum hydroxide, magnesium hydroxide, or aluminum oxide. The weight of the solid content of the composition is 10% to 40%. For example, adding silica can reduce the thermal expansion coefficient of the hardened product, magnesium hydroxide and alumina can increase the flame-resistance of the product, and alumina can improve heat conduction, etc.

The purpose of the invention is to provide a thermosetting resin composition of a new modified flame-resistant maleic anhydride and epoxy resin for use in halogen-free high frequency applications. The composition can be completely dissolved in a solvent at room temperature to form a stable homogeneous-phase varnish, which can be used to make prepreg, copper clad laminate (CCL), and printed circuit boards (PCB).

Prepreg is prepared by mixing the resin composition of the present invention into a varnish, then using a reinforcing material via a composition impregnated with an epoxy resin, and evaporating the solvent using a heated oven while the resin composition partially reacts to give a semi-cured film (B-stage). The reinforcing material may be glass fiber, carbon fiber, Kevlar fiber, or paper fiber such as an aromatic polyamide paper, etc. The prepreg can be further press-formed to make a copper foil substrate; the combination of one or more prepregs with copper foil placed on the upper and lower sides, and the composition is heated to obtain a copper foil substrate composite material. The resin composition of the invention has a high glass transition temperature (Tg), excellent heat-resisting properties and excellent electrical characteristics after hardening. It also has a low coefficient of expansion and a high-level indirect force allowing it to be used for general or high-frequency printed circuit boards. This invention is further explained with the following implementation examples as a reference.

Example 1

20 g of benzo-resistant heat-resistant resin (KUEN BONG Chemical Industry Corp., KB-610F), 20 g of dimethylbenzene resin (Nan Ya plastic NPPN-260) and 60 g of benzaldehyde type resin (Nan Ya plastic NPPN-433) were preliminarily dissolved in methyl ethyl ketone (MEK) to form a 70% solution, to which 15 g of the modified flame-retardant styrene maleic anhydride (SMA) copolymer (B) (as shown above) was then added, 15 g of phosphorus-containing phenolic resin (SHIN-A T&C LC950) and 15 g of phospho-silicate flame retardant (Otsuka Chemical Co., Ltd. SPB-100), 62 g of surface-treated inorganic filler powder $SIO_2$ (Sibelco Asia Pte. Ltd 525ARI) and 1 g of silica coupling agent (A187S). These additives were dissolved in methyl ethyl ketone (MEK) to form a 60% solution and 0.150 g of 2E4MZ(2-Ethyl-4-methylimidazole) accelerator. Compared to the overall solid resin content, the ratio of copolymer (B) of the modified flame-retardant styrene maleic anhydride (SMA) and epoxy resin is 20%.

The resin composition was stirred for 3 hours and then tested for gelation time on a hot plate at 170° C. for 250 seconds. The solution was fed into a bath container and continuously impregnated with a glass fiber cloth (Model 7628). The solvent is volatilized while the resin composition partially reacts to exhibit a semi-cured film (B-stage). The oven is cooled to room temperature and the prepreg is cut into flakes. One copper foil (specification 1 oz) is placed up and down the 8 semi-cured films, and then the hot press with the heating rate at 2.5° C./min is used to increase the temperature to 200° C. for 60 to 120 minutes. Pressure is maintained at 20 to 30 kg/cm$^2$ and the process is completed by pressing the resin composition using the hot press until hardening (C-stage). The glass transition temperature (Tg)

was tested above 150° C. and the material has excellent heat resistance. Physical property test data is listed in Table II Example 2

20 g of benzo-resistant heat-resistant resin (KUEN BONG Chemical Industry Corp. KB-610F), 20 g of dimethylbenzene resin (Nan Ya plastic, NPPN-260) and 60 g of benzaldehyde type resin (Nan Ya plastic, NPPN-433) were initially dissolved in methyl ethyl ketone (MEK) to form a 70% solution, of which 30 g is the modified flame-retardant styrene maleic anhydride copolymer (B). 15 g of phosphorus-containing phenolic resin (SHIN-A T&C LC950) and 15 g of phosphorus-nitrogen flame retardant (Otsuka Chemical Co., Ltd. SPB-100) were added. 68 g of surface-treated inorganic filler powder $SIO_2$ (Sibelco Asia Pte. Ltd 525ARI) and 1 g of silicon and magnesium coupling agent (A187S) were also added. All the additives were dissolved in methyl ethyl ketone (MEK) to form a 60% solution and 0.05 g of the 2E4MZ (2-Ethyl-4-methylimidazole) accelerator. Compared to the overall resin solid content, the ratio of copolymer (B) of the modified flame-retardant styrene maleic anhydride and epoxy resin is 40%. Physical property test data is listed in Table II.

Example 3

The ratio of copolymer (B) of the modified flame-retardant styrene maleic anhydride and epoxy resin according to the manufacturing method in example 1 is 60%. Physical property test data is listed in Table II.

Example 4

The ratio of copolymer (B) of the modified flame-retardant styrene maleic anhydride and epoxy resin according to the manufacturing method in example 1 is 80%. Physical property test data is listed in Table II.

Example 5

20 g of benzo-resistant heat-resistant resin (KUEN BONG Chemical Industry Corp., KB-610F), 20 g of dimethylbenzene resin (Nan Ya plastic, NPPN-260) and 60 g of dicyclopentadiene resin (DIC. 7200H) were initially dissolved in methyl ethyl ketone (MEK) to form a 70% solution, of which 45 g is modified flame-retardant styrene maleic anhydride copolymer (B). 15 g of phosphorus-containing phenolic resin (SHIN-A T&C LC950) and 20 g of phosphorus-nitrogen flame retardant (Otsuka Chemical Co., Ltd. SPB-100) were added as was 70 g of surface-treated inorganic filler powder $SIO_2$ (Sibelco Asia Pte. Ltd 525ARI) and 1 g of silicon and magnesium coupling agent (A187S). All additives were dissolved in methyl ethyl ketone (MEK) to form a 60% solution and 0.125 g of the 2E4MZ (2-Ethyl-4-methylimidazole) accelerator. Compared to the overall resin solid content, the ratio of copolymer (B) of the modified flame-retardant styrene maleic anhydride (SMA) and the epoxy resin is 66%. Physical property test data is listed in Table II.

Example 6

20 g of benzo-resistant heat-resistant resin (KUEN BONG Chemical Industry Corp., KB-610F), 20 g of dimethylbenzene trifunctional resin (Nan Ya plastic, NPPN-260) and 60 g of dicyclopentadiene resin (DIC. 7200H) were initially dissolved in methyl ethyl ketone (MEK) to form a 70% solution, of which 45 g was the modified flame-retardant styrene maleic anhydride copolymer (B) 15 g of phosphorus-containing phenolic resin (SHIN-A T&C LC950) and 20 g of phosphorus-nitrogen flame retardant (Otsuka Chemical Co., Ltd. SPB-100) were added as was 70 g of the surface-treated inorganic filler powder $SIO_2$ (Sibelco Asia Pte. Ltd 525ARI) and 1 g of silicon and magnesium coupling agent (A187S). All additives were dissolved in methyl ethyl ketone (MEK) to form a 60% solution and 0.125 g of the 2E4MZ (2-Ethyl-4-methylimidazole) accelerator. Compared to the overall resin solid content, the ratio of copolymer (B) of the modified flame-retardant styrene maleic anhydride (SMA) and epoxy resin is 63%. Physical property test data is listed in Table II.

Comparison Example 1

20 g of benzo-resistant heat-resistant resin (KUEN BONG Chemical Industry Corp., KB-610F), 20 g of dimethylbenzene trifunctional resin (Nan Ya plastic, NPPN-260) and 60 g of dicyclopentadiene resin (DIC 7200H) were initially dissolved in methyl ethyl ketone (MEK) to form a 70% solution, of which 45 g was modified flame-retardant styrene maleic anhydride copolymer (styrene: 1; maleic anhydride: 4) EF40. 15 g of phosphorus-containing phenolic resin (SHIN-A T&C LC950) and 30 g of phosphorus-nitrogen flame retardant (Otsuka Chemical Co., Ltd., SPB-100) were added as was 75 g of the surface-treated inorganic filler powder $SIO_2$ (Sibelco Asia Pte. Ltd .525ARI) and 1 g of silicon and magnesium coupling agent (A187S). All additives were dissolved in methyl ethyl ketone (MEK) to form a 60% solution and 0.05 g of the 2E4MZ accelerator. Compared to the overall resin solid content, the ratio of copolymer (B) of the modified flame-retardant styrene maleic anhydride (SMA) and epoxy resin is 60%. The physical property test data for the preparation method in example one is listed in Table II.

Comparison Example 2

As shown in Example one, the addition of 60 g of styrene maleic anhydride (SMA) copolymer (styrene: 1; maleic anhydride: 4) EF40 and its physical property test data are listed in Table II.

TABLE 1

The equivalent ratio range of example implementation and comparison examples:

| | Implementation example | | | | | | Comparison example | |
|---|---|---|---|---|---|---|---|---|
| | 1 | 2 | 3 | 4 | 5 | 6 | 1 | 2 |
| Equivalent ratio (%) | 20 | 40 | 60 | 80 | 44 | 42 | 60 | 80 |

TABLE 2

Substrate characteristics of implementation examples and comparison examples:

| | Implementation example | | | | | | Comparison example | |
|---|---|---|---|---|---|---|---|---|
| | 1 | 2 | 3 | 4 | 5 | 6 | 1 | 2 |
| Glass transition temperature (DSC), °C. | 158 | 165 | 175 | 170 | 175 | 176 | 168 | 169 |
| Copper foil tear strength lb/in | 7.5 | 7.5 | 8.0 | 7.8 | 7.8 | 7.9 | 7.2 | 6.9 |
| Substrate surface layer | 5.2 | 5.3 | 5.5 | 5.0 | 5.8 | 5.7 | 4.5 | 4.3 |
| Solder heat resistance test (288° C.), min | >10 | >10 | >10 | >10 | >10 | >10 | 5~10 | 5~10 |
| Cracking temperature (Td), °C. | 375 | 379 | 380 | 382 | 385 | 390 | 385 | 377 |
| T288 (TMA), min(including copper) | >40 | >40 | >40 | >40 | >40 | >40 | >40 | >40 |
| CTE, ppm/°C. | 2.6 | 2.5 | 2.4 | 2.4 | 2.4 | 2.3 | 2.8 | 2.9 |
| Dielectric constant (1 GHz) | 4.20 | 4.18 | 4.06 | 3.98 | 4.05 | 4.11 | 4.10 | 4.22 |
| Loss factor (1 GHz) | 0.007 | 0.0068 | 0.0066 | 0.0062 | 0.0070 | 0.0061 | 0.009 | 0.008 |
| Flame-resistance test | V-0 | V-0 | V-0 | V-0 | V-0 | V-0 | V-1 | V-1 |

A composition of a modified flame-resistant maleic anhydride hardener and an epoxy resin passes the tests for the copper foil substrate IPC-TM650 for glass transition temperature (Tg), copper foil tear strength, thermal decomposition temperature (Td), thermal stratification time (T288), solder heat resistance (288° C.), dielectric constant Dk), and dielectric loss factor (Df) and other tests. The results from the physical properties tests indicate that the invention has multi-range glass transition temperature (Tg), excellent heat resistance and electrical properties, while reducing the addition of phosphorus (nitrogen) flame retardant to reach the 94-V0 level, hence making it suitable for the production of electronic components and printed circuit board substrate materials.

The composition of the modified maleic anhydride and the epoxy resin provided by this invention has:

1. High glass transition temperature (Tg) and can be used for high-level printed circuit boards or carrier boards;

2. Excellent heat resistance, withheld the solder heat test for more than 60 minutes, it will not produce a bleaching board, layered phenomenon. T288 (copper) stratification time is longer than 40 minutes;

3. Excellent thermal properties, thermal cracking temperature (Td) is greater than 375° C., in line with the current halogen-free and lead-free processing requirements;

4. Has excellent electrical properties, can reduce the signal transmission delay and signal distortion at a high frequency.

The composition of the modified maleic anhydride and the epoxy resin has a good heat resistance and excellent electrical characteristics, suitable for the production of prepreg, adhesive sheets, copper foil laminated boards, and can be used for general or high frequency printed circuit boards.

What we claimed is:

1. A resin composition comprising the following components (A) a mixture of one or more epoxy resins, (B) a copolymer of a modified flame-retardant styrene maleic anhydride (SMA), (C) an additive, and (D) an inorganic filler, wherein the structure of the copolymer of the modified flame-retardant styrene maleic anhydride of (B) is as following formula:

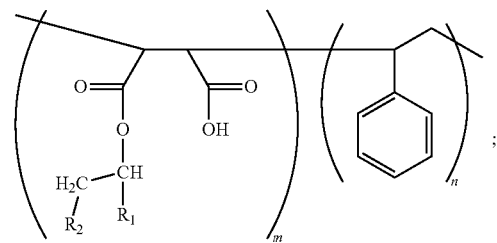

wherein m and n are positive integers, and m and n are the same or different;

wherein $R_1$ is an epoxy resin polymer chain, and the epoxy resin polymer chain is bisphenol A epoxy resin or bisphenol F epoxy resin;

wherein $R_2$ is a DOPO(9,10-dihydro-9-oxa-10-phosphaphenanthrene-10-oxide) derivative of a phosphorus-based compound; the DOPO derivative of a phosphorus-based compound is DOPO(9,10-dihydro-9-oxa-10-phosphine-10-oxide), DOPO-HQ (10-(2,5-dihydroxyphenyl)-10H-9-oxa-10-phosphaphenanthrene-10-oxide), or DOPO-NQ (9,10-dihydro-9-oxa-10-phosphaphenanthrene-10-oxide quinone compound

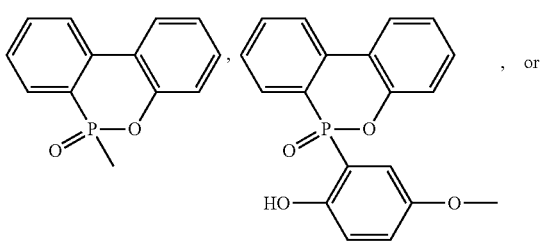

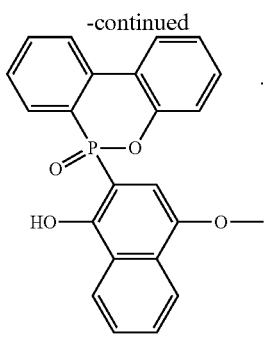

2. The resin composition as claimed in claim 1, wherein the component (A) epoxy resin mixture includes a resin mixture of one or more heterocyclic epoxy resins and at least one of bisphenol F epoxy resin, bisphenol A epoxy resin, and polyfunctional epoxy resin; wherein an epoxy equivalent of bisphenol F epoxy resin is 150-3,000 g/eq, an epoxy equivalent of bisphenol A epoxy resin is 150 to 3,000 g/eq, and an epoxy equivalent of the polyfunctional epoxy resin 150 to 3,000 g/eq.

3. The resin composition as claimed in claim 1, wherein the component (A) epoxy resin mixture accounts for 60% to 80% of the total weight of the solid composition excluding the inorganic filler.

4. The resin composition as claimed in claim 1, wherein the component (B) modified flame-retardant styrene maleic anhydride (SMA) copolymer accounts for 10% to 40% of the weight of composition solids excluding the inorganic filler.

5. The resin composition as claimed in claim 1, wherein the component (C) additive is added according to the properties of the composition, which is one or more mixtures of high-molecular weight phenoxy resins, rubbers, phosphorus phenolic resins and flame retardants.

6. The resin composition as claimed in claim 1, wherein component (D), the inorganic filler, is selected from the group consisting of crystalline, spherical and molten silica, aluminum hydroxide, magnesium hydroxide, and aluminum oxide, totaling 10% to 40% of the weight of the composition solids.

7. The resin composition as claimed in claim 1, wherein the molecular weight range of the modified flame-retardant styrene maleic anhydride (SMA) copolymer ranges from 2,000 to 15,000.

8. A prepreg which is formed by impregnating or coating a reinforcing material in the resin composition claimed in claim 1.

9. An adhesive sheet which is formed by impregnating or coating a reinforcing material in the resin composition claimed in claim 1.

10. A copper foil laminate which is prepared by hot pressing the prepreg as claimed in claim 8.

11. A printed circuit board comprising the copper foil laminate as claimed in claim 10.

* * * * *